US010903759B2

(12) United States Patent
Arao et al.

(10) Patent No.: US 10,903,759 B2
(45) Date of Patent: Jan. 26, 2021

(54) POWER CONVERSION DEVICE AND POWER CONVERSION DEVICE SYSTEM

(71) Applicant: Hitachi Industrial Equipment Systems Co., Ltd., Tokyo (JP)

(72) Inventors: Yusuke Arao, Tokyo (JP); Kazushige Hotta, Tokyo (JP)

(73) Assignee: Hitachi Industrial Equipment Systems Co., Ltd., Tokyo (JP)

( * ) Notice: Subject to any disclaimer, the term of this patent is extended or adjusted under 35 U.S.C. 154(b) by 184 days.

(21) Appl. No.: 16/323,683

(22) PCT Filed: Dec. 26, 2016

(86) PCT No.: PCT/JP2016/088667
§ 371 (c)(1),
(2) Date: Feb. 6, 2019

(87) PCT Pub. No.: WO2018/122911
PCT Pub. Date: Jul. 5, 2018

(65) Prior Publication Data
US 2019/0173396 A1 Jun. 6, 2019

(51) Int. Cl.
*G01R 19/165* (2006.01)
*H02M 7/5387* (2007.01)
(Continued)

(52) U.S. Cl.
CPC .. *H02M 7/53871* (2013.01); *G01R 19/16528* (2013.01); *H02H 7/1222* (2013.01);
(Continued)

(58) Field of Classification Search
USPC ...................................................... 361/18, 23
See application file for complete search history.

(56) References Cited

U.S. PATENT DOCUMENTS

| 2005/0180065 | A1* | 8/2005 | Chapuis | ................... G06F 1/26 361/18 |
|---|---|---|---|---|
| 2008/0049467 | A1 | 2/2008 | Takayanagi | |

(Continued)

FOREIGN PATENT DOCUMENTS

| CN | 1502918 A | 6/2004 |
|---|---|---|
| CN | 1719680 A | 1/2006 |

(Continued)

OTHER PUBLICATIONS

International Search Report (PCT/ISA/210) issued in PCT Application No. PCT/JP2016/088667 dated Feb. 28, 2017 with English translation (five (5) pages).

(Continued)

*Primary Examiner* — Danny Nguyen
(74) *Attorney, Agent, or Firm* — Crowell & Moring LLP

(57) ABSTRACT

Provided is a power conversion device with which it is possible to acquire a sign of a system stop before the system stops, and to minimize the nonworking time of the system. A power conversion device for converting DC voltage or AC voltage into AC voltage, the power conversion device being characterized by having an abnormality detection unit for detecting abnormalities in the power conversion device, a restart unit for stopping the power conversion device and automatically performing a restart when the abnormality detection unit has detected an abnormality, a restart recording unit for recording restart information of when the restart unit has restarted, and a sign diagnostic unit for inputting the restart information recorded by the restart recording unit and performing a sign diagnosis of the abnormality in the power conversion device on the basis of the restart information, the sign diagnostic unit performing the sign diagnosis on the basis of the number of restarts and outputting a sign diagnostic result.

14 Claims, 6 Drawing Sheets

(51) Int. Cl.
   *H02H 7/122*   (2006.01)
   *H02M 1/32*    (2007.01)
   *H02M 1/00*    (2006.01)
   *H02M 5/458*   (2006.01)

(52) U.S. Cl.
   CPC ............ *H02H 7/1227* (2013.01); *H02M 1/32*
      (2013.01); *H02M 5/458* (2013.01); *H02M*
      *2001/0009* (2013.01); *H02M 2001/327*
      (2013.01)

(56) References Cited

U.S. PATENT DOCUMENTS

| | | |
|---|---|---|
| 2012/0075893 A1 | 3/2012 | Higuchi |
| 2015/0236499 A1 | 8/2015 | Wang et al. |

FOREIGN PATENT DOCUMENTS

| | | |
|---|---|---|
| CN | 101323048 A | 12/2008 |
| CN | 101945520 A | 1/2011 |
| CN | 102437553 A | 5/2012 |
| JP | 8-126338 A | 5/1996 |
| JP | 2001-327175 A | 11/2001 |
| JP | 2004-242480 A | 8/2004 |
| JP | 2008-245497 A | 10/2008 |
| JP | 2015-146658 A | 8/2015 |

OTHER PUBLICATIONS

Japanese-language Written Opinion (PCT/ISA/237) issued in PCT Application No. PCT/JP2016/088667 dated Feb. 28, 2017 (three (3) pages).
Extended European Search Report issued in European Application No. 16925537.9 dated Jul. 8, 2020 (eight pages).
Chinese-language Office Action issued in Chinese Application No. 201680087666.2 dated Jul. 14, 2020 with English translation (14 pages).

\* cited by examiner

F I G. 6
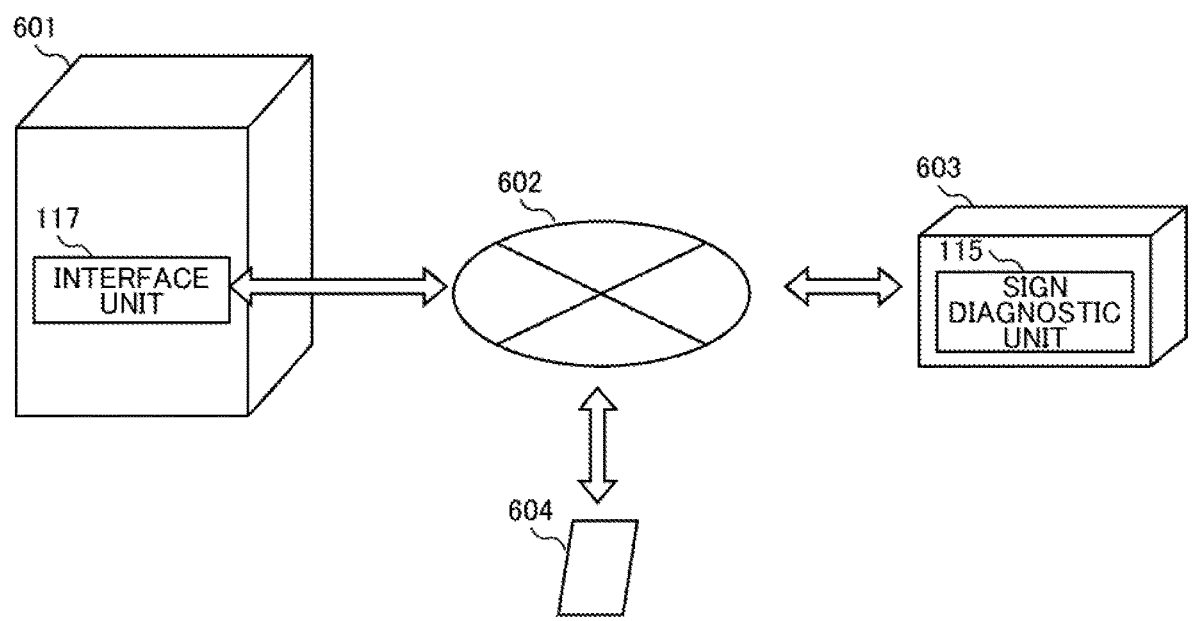

POWER CONVERSION DEVICE AND POWER CONVERSION DEVICE SYSTEM

TECHNICAL FIELD

The present invention relates to a power conversion device that converts a DC voltage or an AC voltage into an AC voltage.

BACKGROUND ART

For example, in a power conversion device that drives a motor, it is necessary to stop an operation of the device if an abnormality continues.

As a background technology in this technical field, JP 2001-327175 A (Patent Document 1) discloses that "An AC power is applied to a rectifying circuit 4 via a power source switching means 3 connected to an AC power source 1. A DC power of the rectifying circuit 4 is converted into an AC power by an inverter circuit 5 to drive a motor 7. An overcurrent of the inverter circuit 5 is detected by an overcurrent detecting means 6. A control means 12 has an inverter control circuit 12a for controlling the power source switching means 3 and the inverter circuit 5 and determining a fault content of the inverter circuit 5 or the motor 7, an inverter drive circuit 12b for driving the inverter circuit 5, a switching means drive circuit 12c for driving the power source switching means 3, and a memory means 12d for storing the fault content. The control means 12 inhibits an operation when the fault content stored in the memory means 12d occurs predetermined times or more" (see Abstract).

CITATION LIST

Patent Document

Patent Document 1: JP 2001-327175 A

SUMMARY OF THE INVENTION

Problems to be Solved by the Invention

Patent Document 1 describes a method of inhibiting the operation when stored specific fault content occurs a predetermined number of times or more, notifying the fault so as not to repeat the operation. However, in the method of Patent Document 1, since the fault is repeated a predetermined number of times and the fault is notified only after the system stops, there is a problem that a user does not know the fault situation until the system stops. Further, there is a problem that the system unnecessarily stops when, for example, the number of one single fault occurred due to a transient phenomenon exceeds a predetermined number of times due to long-term driving. Further, in Patent Document 1, a method of manually starting the operation after clearing the fault content is described, but there is a problem that it is not possible to prepare in advance a member or the like necessary for restoration and it takes a long time to restart the system.

It is an object of the present invention to provide a power conversion device capable of acquiring a sign of system shutdown before a system stops and minimizing a non-operation time of a system.

Solutions to Problems

In order to solve the aforementioned problem, for example, configurations described in the claims are adopted.

Although the present application includes a plurality of means to solve the aforementioned problem, for example, a power conversion device for converting DC voltage or AC voltage into AC voltage is provided, and the device includes an abnormality detection unit that detects abnormality in the power conversion device, a restart unit that stops the power conversion device and automatically performs a restart when the abnormality detection unit has detected an abnormality, a restart recording unit that records restart information acquired when the restart unit has restarted, and a sign diagnostic unit that inputs the restart information recorded in the restart recording unit and performs a sign diagnosis of the abnormality in the power conversion device on the basis of the restart information, in which the sign diagnostic unit performs the sign diagnosis on the basis of the number of restarts and outputs a sign diagnosis result.

Effects of the Invention

According to the present invention, it is possible to acquire a sign of system shutdown before a system stops, and it is possible to minimize a non-operation time of the system.

Problems, configurations, and effects other than those described above will be clarified from description of embodiments described below.

BRIEF DESCRIPTION OF THE DRAWINGS

FIG. 6 is an example of a schematic diagram of a power converter system in a fourth embodiment.

MODE FOR CARRYING OUT THE INVENTION

Hereinafter, embodiments of the present invention will be described below with reference to the drawings.

First Embodiment

In the present embodiment, an example of operation in which a power conversion device in a state where an operation instruction is input from an external device performs an output to an electric motor will be described.

Figure 1:
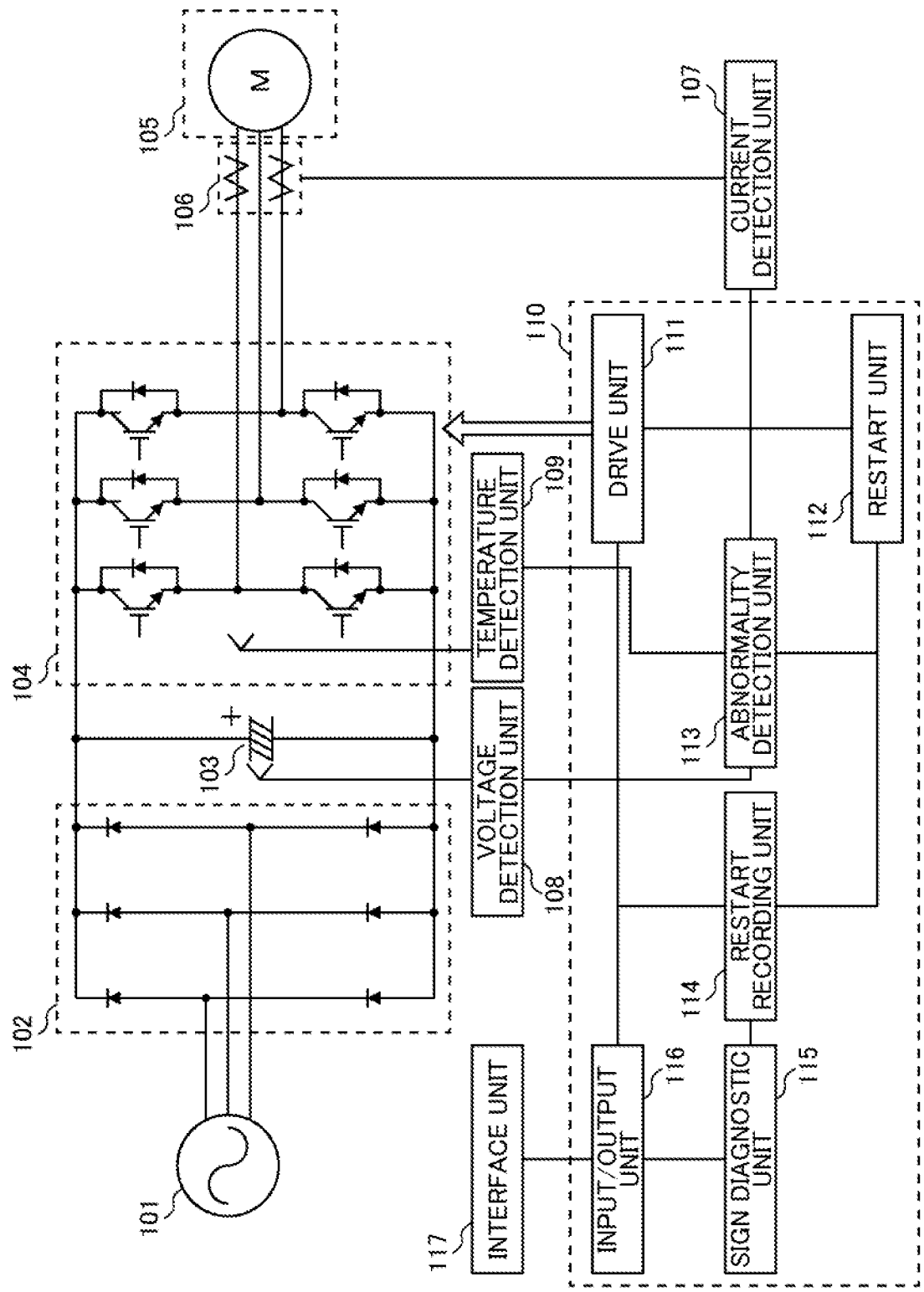
FIG. 1 is an example of a configuration diagram of a power conversion device in a first embodiment.

FIG. 1 illustrates an example of a configuration diagram of a three-phase AC power source 101, a power conversion device of the present embodiment, and a user system 105.

The power conversion device of the present embodiment includes a DC conversion unit 102, a smoothing capacitor 103, an AC conversion unit 104, a control unit 110, a current detector 106, a current detection unit 107, a voltage detection unit 108, a temperature detection unit 109, and an interface unit 117. Then, the control unit 110 includes a drive unit 111, a restart unit 112, an abnormality detection unit 113, a restart recording unit 114, a sign diagnostic unit 115, and an input/output unit 116.

The three-phase AC power source 101 is, for example, a three-phase AC voltage supplied from a power company or an AC voltage supplied from a generator, and outputs the AC voltage to the DC conversion unit 102.

The DC conversion unit 102 is constituted by, for example, a DC conversion circuit constituted by diodes and a DC conversion circuit using an IGBT and a flywheel diode, converts the AC voltage input from the three-phase AC power source 101 into a DC voltage, and outputs the same to the smoothing capacitor 103. In FIG. 1, the DC conversion unit 102 constituted by diodes is illustrated as an example.

The smoothing capacitor 103 smoothes the DC voltage input from the DC conversion unit 102 and outputs the DC voltage to the AC conversion unit 104. When an output of a generator is a DC voltage, the smoothing capacitor 103 may directly receive a DC voltage from a DC generator without passing through the DC conversion unit 102.

The AC conversion unit 104 is constituted by an AC conversion circuit using, for example, an IGBT and a flywheel diode, receives the DC voltage of the smoothing capacitor 103 and an output instruction of the drive unit 111 as an input and converts the DC voltage into an AC voltage, and outputs the same to an AC electric motor of the user system 105. In addition, in a case where the AC conversion unit 104 is constituted by an AC conversion circuit that performs an AC-AC conversion without passing through the smoothing capacitor 103, the AC conversion unit 104 may convert the AC voltage into an AC voltage and output the AC voltage to the AC electric motor.

The user system 105 is a user system operating with the power conversion device, and in FIG. 1, a system operating with the AC electric motor as an example is illustrated.

The current detector 106 is a current detector that detects an output current of the power conversion device, and is constituted by, for example, a Hole CT or a shunt resistor. As long as the current detector 106 is arranged at a position where a three-phase AC current may be detected or predicted, the current detector 106 may be used in a place other than the example in FIG. 1.

The current detection unit 107 receives a detection value of the current detector 106 as an input, converts the same into output current data to be used in the control unit 110, and outputs the data to the abnormality detection unit 113.

The voltage detection unit 108 receives a voltage detection value of the smoothing capacitor 103 as an input, converts the same into DC voltage data to be used in the control unit 110, and outputs the data to the abnormality detection unit 113.

The temperature detection unit 109 receives a temperature detection value of the AC conversion unit 104 as an input, converts the same into temperature data to be used in the control unit 110, and outputs the data to the abnormality detection unit 113. Although the temperature detection unit 109 is arranged to detect the temperature of the AC conversion unit 104 as an example, it may be arranged in other parts of the power conversion device, for example, the DC conversion unit 102 and the smoothing capacitor 103.

The control unit 110 is constituted by, for example, a microcomputer or the like, and performs data storage, various calculation and control.

The drive unit 111 receives an instruction from the restart unit 112, calculates an output for driving the AC conversion unit 104 according to an instruction frequency and an instruction voltage calculated by the control unit 110, and outputs the same to the AC conversion unit 104.

The restart unit 112 receives an abnormality detection signal of the abnormality detection unit 113 as an input, waits until an abnormal state is canceled, for example, by waiting for a predetermined period or the like, and gives an instruction of automatically restarting to the drive unit 111. In addition, the restart unit 112 outputs the abnormality information acquired when a restart instruction is given to the restart recording unit 114.

The abnormality detection unit 113 receives the detection data of the current detection unit 107, the voltage detection unit 108, and the temperature detection unit 109 as inputs, determines whether the data is in an abnormal state, and gives an output cutoff instruction to the drive unit 111 and the restart unit 112.

The restart recording unit 114 receives the restart instruction of the restart unit 112 as an input, and stores information (error information) at the time of occurrence of an error that caused the restart detected by the abnormality detection unit 113. In addition, the restart recording unit 114 outputs restart information to the input/output unit 116. Incidentally, when a display instruction of the restart information is given to the input/output unit 116 only for a predetermined period of time after the restart and normal operation of the power conversion device continues, the restart recording unit 114 may not display the restart information.

The sign diagnostic unit 115 receives the restart information stored in the restart recording unit 114 as an input, performs a sign diagnosis within a first predetermined period based on the restart information, and sends a result of the diagnosis to the input/output unit 116. The sign diagnosis is a life diagnosis of life parts of the power conversion device, for example, a smoothing capacitor, a capacitor mounted on a substrate and a cooling fan or a sign diagnosis of a change caused by deterioration of cooling capacity due to clogging of fins and the like and deterioration or abnormality of an external system.

The input/output unit 116 receives instructions from the restart recording unit 114 and the sign diagnostic unit 115 as inputs, and outputs display data or I/O data to the interface unit 117. Further, the input/output unit 116 receives an instruction from the interface unit 117 as an input, and outputs the instruction to the drive unit 111 and the like.

Figure 2:
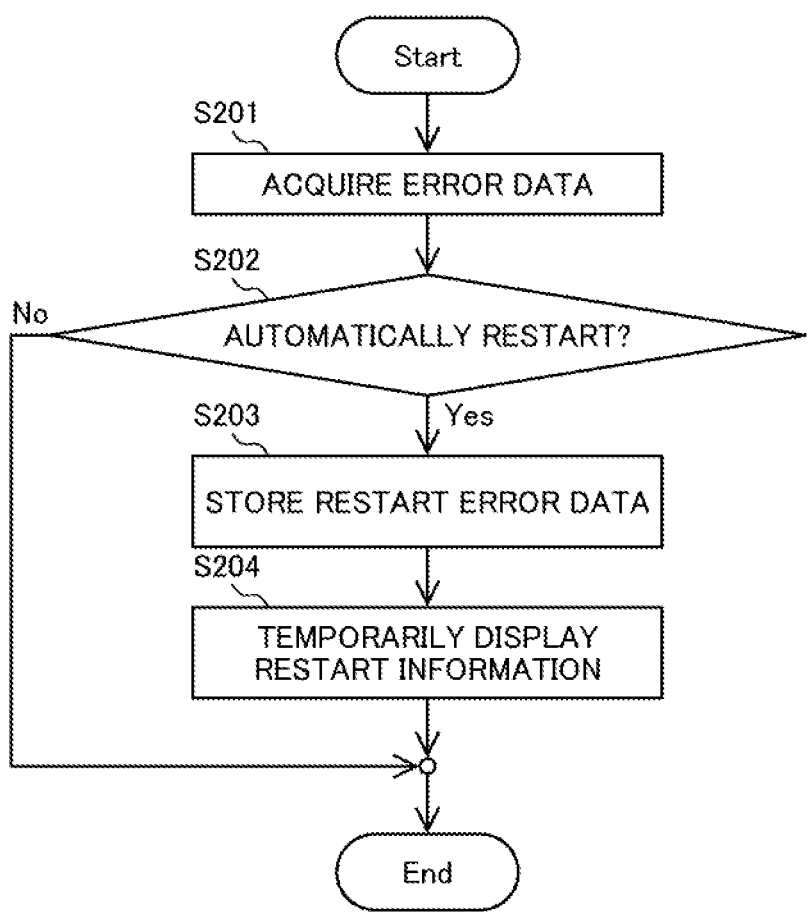
FIG. 2 is a flowchart illustrating a processing procedure performed by a restart recording unit in the first embodiment.

FIG. 2 is a flowchart illustrating a processing procedure performed by the restart recording unit 114.

The restart recording unit 114 acquires an error cause generated by the abnormality detection unit 113 and information of the power conversion device at that time (S201). Then, the restart recording unit 114 determines whether the restart unit 112 has been automatically restarted based on information indicating whether the restart unit 112 has been restarted (S202). When the restart unit 112 has been automatically restarted, the restart recording unit 114 stores the data acquired by the abnormality detection unit at the time of the error (S203). Then, the restart recording unit 114 instructs the input/output unit 116 to temporarily display the information at the time of restart (S204). For example, the information at the time of the restart includes the number of times of the restart occurred in a predetermined period or detailed information regarding a cause of occurrence of the restart within a predetermined period, for example, a date and time, an output frequency, an output current, a DC voltage, an internal temperature and the like. In addition, the input/output unit 116 temporarily instructs the interface unit 117 to display restart error information, because it is necessary to monitor various internal information when a normal operation state continues since the power conversion device is in operation. Further, whether the various internal information is displayed or the restart error information is displayed may be selectable by a user. When the restart information is always displayed, the information having the data stored in advance in the restart recording unit 114 is called and the restart information is always displayed. Further, the user can browse the previous restart information stored in the restart recording unit 114 by operating the interface unit 117.

Figure 3:
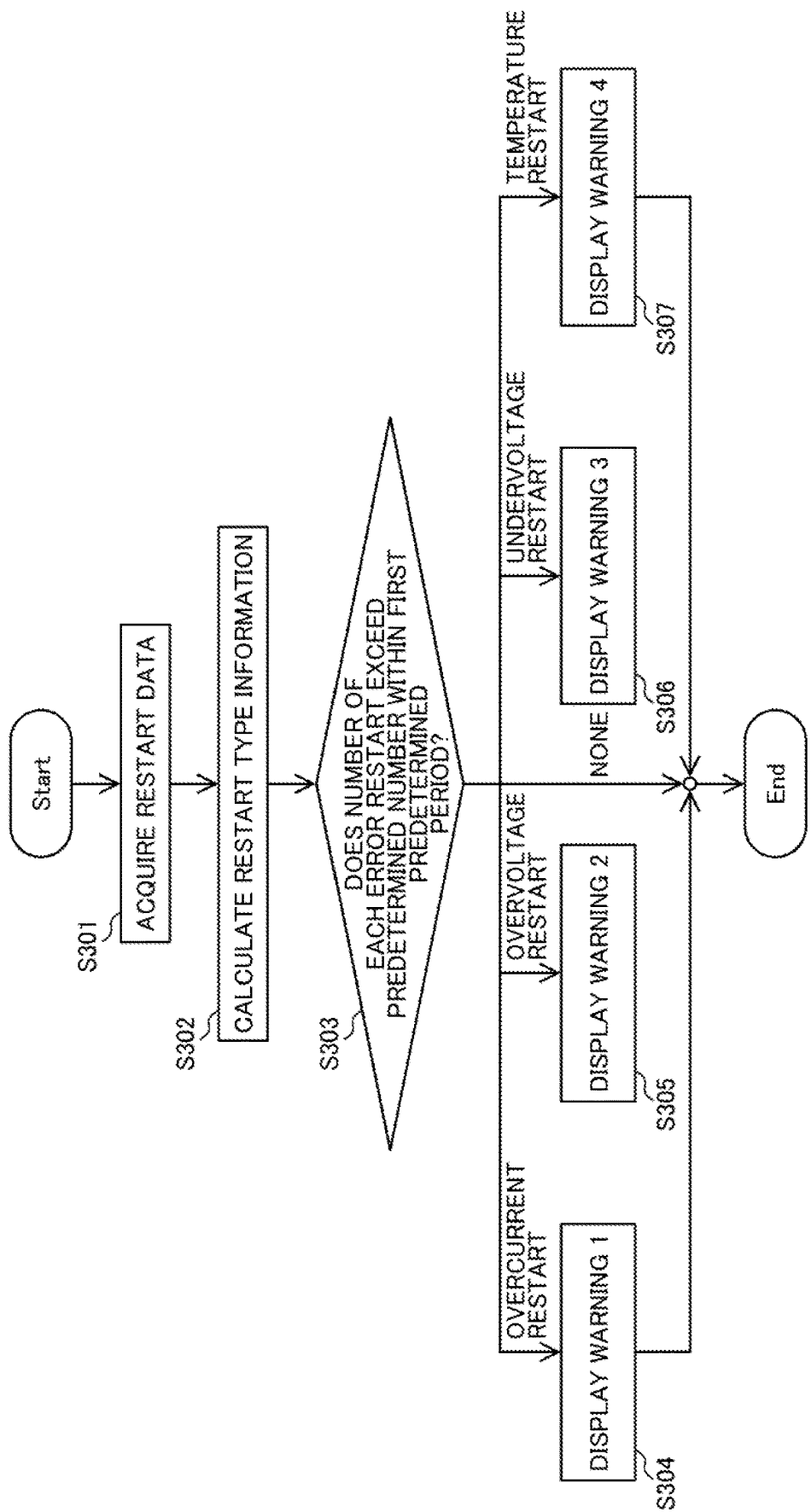
FIG. 3 is a flowchart illustrating a procedure in which a sign diagnostic unit issues an instruction in the first embodiment.

FIG. 3 is a flowchart illustrating a procedure in which the sign diagnostic unit 115 issues an instruction.

The sign diagnostic unit 115 acquires the restart data stored in the restart recording unit 114 (S301). The sign diagnostic unit 115 counts the number of errors occurred within a first predetermined period for each restart type (S302). The first predetermined period may be a long period such as a month or a half year or may be a unit of a day or a week. This period is selectively determined according to an operation status of the system. When the respective numbers of error restarts exceeds a predetermined number (S303), the sign diagnostic unit 115 outputs a warning based on the exceeded error. Normally, when adopting a power conversion device, confirmation by trial operation and setting with margin are performed in order to prevent the system from stopping, so restart due to transient error due to load fluctuation does not occur frequently. However, due to aged deterioration of the power conversion device or the system, a frequency of an error occurrence increases.

In S304, a warning 1 is displayed when overcurrent restart exceeds the predetermined number of times.

For example, when operating a system that drives a fan or a pump, it is set to display the warning 1 when the restart caused by the overcurrent is detected five times or more per month. The current gradually flows excessively due to various causes such as an increase in inertia due to contamination of the fan or the pump or an increase in starting torque due to clogging of a flow path. In particular, a current increase due to dirt or clogging temporarily improves as clogging is taken by driving a motor, but it may happen again after a while and the warning 1 can be issued by monitoring an increase in the number of the restart. The user confirms the warning 1 and performs maintenance of the fan, the pump, and the system, so that it is possible to prevent unnecessary system shutdown.

In S305, a warning 2 is displayed when an overvoltage restart exceeds the predetermined number of times.

For example, in the case of decelerating and stopping a system driving a fan or a heavy inertial load, it is set to display the warning 2 when the restart caused by overvoltage is detected more than five times in half a year. Regenerative voltage gradually becomes excessive and the DC voltage of the power conversion device becomes excessive due to various causes such as dirt adhering to the fan, deterioration of bearing and an increase in inertia as a system. Particularly, an increase in DC voltage due to an increase in the inertial load becomes a factor of lowering a life of the smoothing capacitor. By issuing the warning 2 by monitoring the increase in the number of the restart of overvoltage, the user confirms the warning 2 and removes the cause, thereby preventing the power conversion device from deteriorating.

In S306, a warning 3 is displayed when an undervoltage restart exceeds the predetermined number of times.

For example, it is set to display the warning 3 when the restart due to undervoltage is detected more than ten times a year. If the smoothing capacitor mounted on the power conversion device deteriorates, voltage ripple sinks greatly and a possibility of becoming the undervoltage increases. In other words, when a life of the capacitor of the power conversion device is decreased, the warning 3 can be issued by monitoring the restart due to an undervoltage error, and the user can confirm the warning 3 and establish a plan to perform maintenance of the power conversion device.

In S307, a warning 4 is displayed when temperature restart exceeds the predetermined number of times.

For example, it is set to display the warning 4 when the restart caused by temperature is detected more than three times a month. In the AC conversion unit 104, in general, a life is shortened when the temperature change is large. In addition, as the smoothing capacitor is used in a high temperature environment, its life becomes shorter. In a case where the user's system requires high torque, if the current flows beyond a rated current gradually and continues flowing due to deterioration of the system or the like, a temperature rise of an internal circuit of the smoothing capacitor 103 or the AC conversion unit 104 may become large and an error may occur in some cases. That is, it is possible to issue the warning 4 by monitoring the restart due to the temperature error, and the user can confirm the warning 4, prevent the power conversion device from deteriorating, lower a switching frequency or the like to prolong a life and establish a plan to perform maintenance of the power conversion device.

According to the present embodiment, by the aforementioned method, it is possible to perform a sign detection of system shutdown before the system stops, thus minimizing a non-operation time of the system.

Second Embodiment

The present embodiment is a modification of the first embodiment in which the sign diagnostic unit sets first and second predetermined periods and compares the respective numbers of the restarts to perform the sign diagnosis. A configuration of the power conversion device according to a second embodiment has the configuration with the same numerals and the same functions as those illustrated in FIG. 1, and description thereof will be omitted.

In the present embodiment, the sign diagnostic unit 115 receives the restart information stored in the restart recording unit 114 as an input, performs the sign diagnosis in the first predetermined period and the second predetermined period based on the restart information, and outputs a result thereof to the input/output unit 116.

Figure 4:
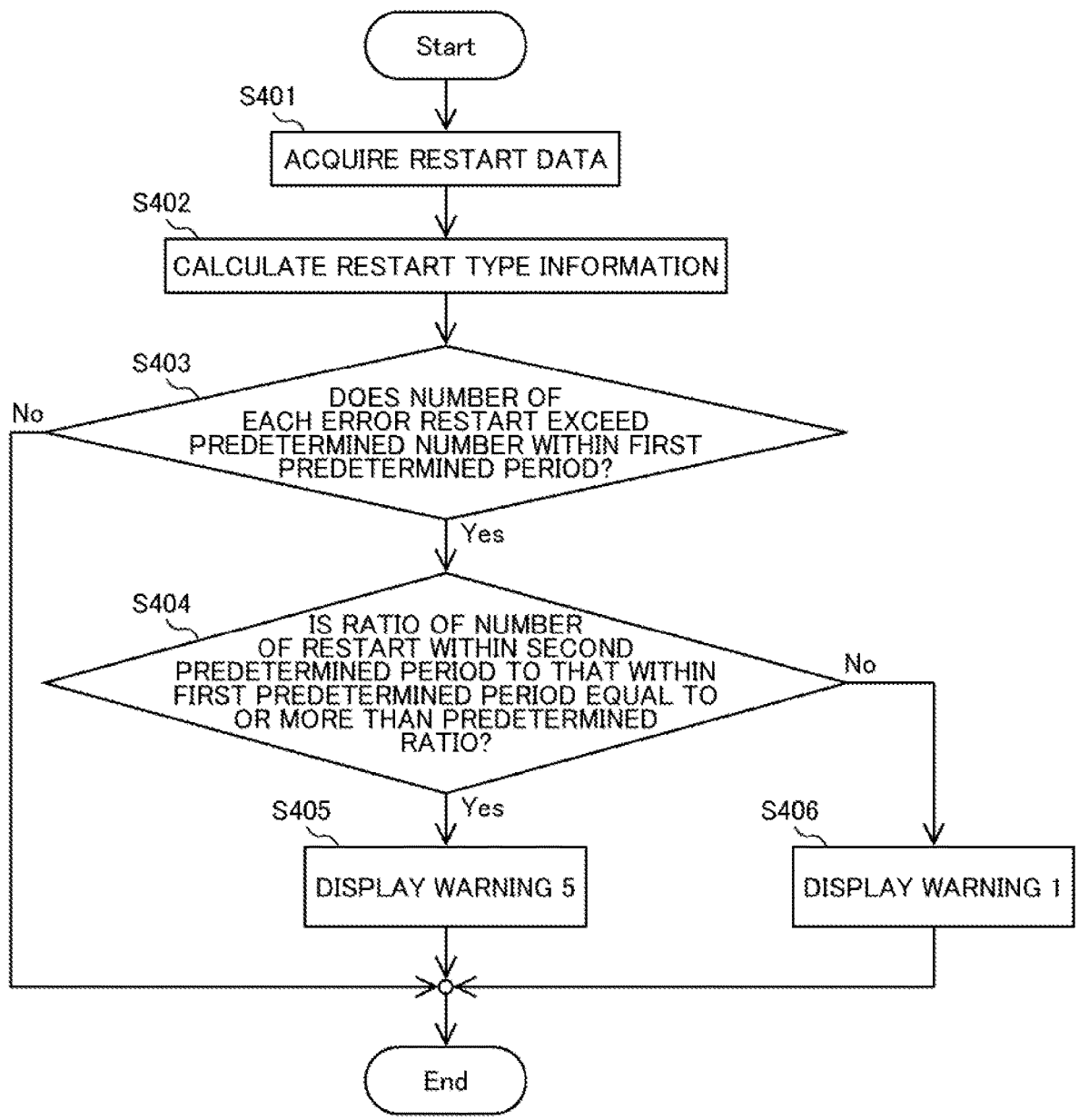
FIG. 4 is a flowchart illustrating a procedure in which a sign diagnostic unit issues an instruction in a second embodiment.

FIG. 4 is a flowchart illustrating a procedure in which the sign diagnostic unit 115 issues the instruction. FIG. 4 particularly describes the case of an overcurrent error restart.

The sign diagnostic unit 115 acquires the restart data stored in the restart recording unit 114 (S401). The sign diagnostic unit 115 counts the number of errors occurred within the first predetermined period and the second predetermined period (S402). For example, when the first predetermined period is set to one day, it is possible to determine whether the error is an error at the time of operating the system during the day by setting 9 o'clock a.m. to 5 o'clock p.m. during one day within the second predetermined period. Further, for example, when the first predetermined period is set to one year, it is possible to determine whether the error is an error when a power consumption amount of an external power source environment is large by setting the time in summer and winter in the second predetermined period. This period is selectively determined according to an operation status of the system. When the respective numbers of error restarts in the first predetermined period exceeds the predetermined number (S403), the sign diagnostic unit 115 compares the numbers of the restarts in the first and second predetermined periods to find a ratio of the number of the restart in the second predetermined period to that in the first predetermined period (S404). Such a ratio is set at 60%, for example, in consideration of a case where it occurred at a frequency of 60% or more as a predetermined ratio.

For example, an example where overcurrent restart exceeds the predetermined number will be described.

In the case of operating a system for driving a fan or a pump, it is set to display a warning 5, for example, when the first predetermined period is set as one day, the second predetermined period is set as 9 o'clock a.m. to 5 o'clock p.m. in one day and the number of the restart due to the overcurrent exceeds five times as the predetermined number. In a case where the user's system has set a system operation state of the day to be high by shortening an acceleration time of the motor or the like, when the restart has occurred three or more times within the second predetermined period, it is determined that it is not the restart requiring maintenance, and the warning 5 indicating that a transient state has occurred is displayed (S405). In addition, when less than three restarts have occurred within the second predetermined time, the warning 1 is displayed as in the first embodiment (S406).

Similarly, when another error occurs, it is also possible to change a type of the warning according to the situation of the user system.

According to the present embodiment, it is possible to perform a sign detection in consideration of the cause of error generation by the aforementioned method.

Third Embodiment

The present embodiment is a modification of the first embodiment in which the sign diagnostic unit performs the sign detection by comparing the number of the restarts in the previous predetermined period with the number of restarts in a predetermined period, for example, one year, one week, and the like. A configuration of the power conversion device according to a third embodiment has the configuration with the same numerals and the same functions as those illustrated in FIG. 1, and description thereof will be omitted.

In the present embodiment, the sign diagnostic unit 115 receives the restart information stored in the restart recording unit 114 as an input, performs the sign diagnosis in the predetermined period based on the restart information, and outputs a result thereof to the input/output unit 116.

Figure 5:
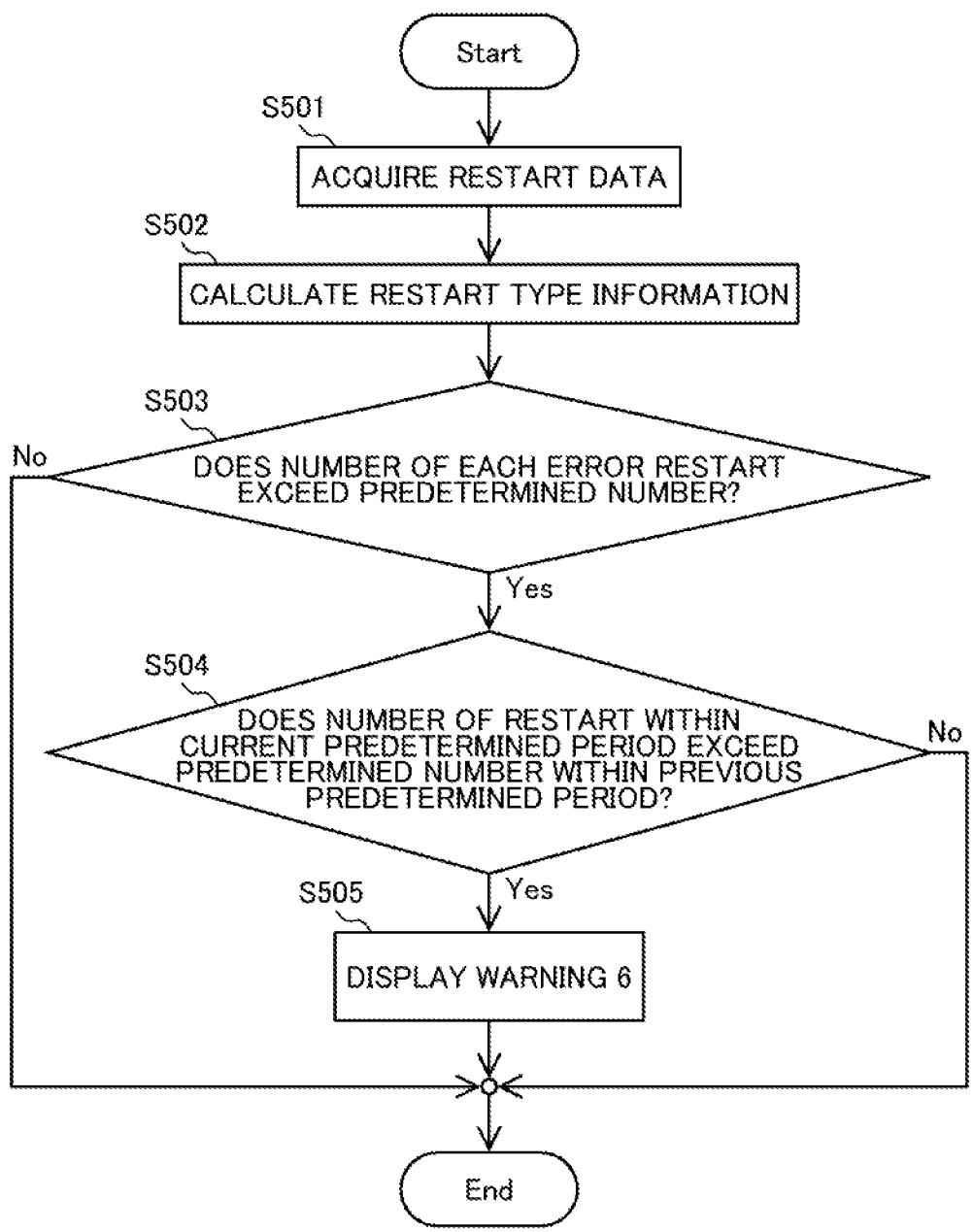
FIG. 5 is a flowchart illustrating a procedure in which a sign diagnostic unit issues an instruction in a third embodiment.

FIG. 5 is a flowchart illustrating a procedure in which the sign diagnostic unit 115 issues the instruction.

The sign diagnostic unit 115 acquires the restart data stored in the restart recording unit 114 (S501). The sign diagnostic unit 115 counts the number of errors that occurred within a predetermined period (S502). For example, it is possible to determine whether an error occurrence deviation has increased due to deterioration of life parts in a life diagnosis by setting a time of a day, a week, or a year. This period is selectively determined according to an operation status of the system. When the respective numbers of error restarts in a present predetermined period exceed the predetermined number of times (S503), the sign diagnostic unit 115 compares the numbers of the present error restart and the restart within the previous predetermined period to determine whether the number of current error restart exceeds the number of the restart within the previous predetermined period (S504).

For example, an example where an undervoltage restart exceeds the predetermined number will be described.

For example, the sign diagnostic unit 115 is set to determine a deviation between the previous time and the present time when the predetermined period is set to one day and the restart due to the undervoltage exceeds five times as the predetermined number. Further, the sign diagnostic unit 115 is set to display a warning 6 when the predetermined number exceeds the previous time by three or more. The sign diagnostic unit 115 starts determining a life when five or more restarts have occurred within the predetermined time. When five or less restarts occur, the sign diagnostic unit 115 determines that it is a routine operation and not a restart requiring maintenance, and does nothing in the present embodiment. When the restart occurs five or more times within the predetermined time and the number of restart occurrences within the present predetermined time exceeds the number of restart occurrences within the previous predetermined time by three or more, the warning 6 indicating that a transient state occurred is displayed (S505).

Similarly, when another error occurs, it is also possible to change a type of the warning according to the situation of the user system.

According to the present embodiment, it is possible to perform a sign detection of deterioration of life parts by the aforementioned method.

Fourth Embodiment

The present embodiment is a modification of the first embodiment in which the sign diagnostic unit, which has been provided within the power conversion device in the first embodiment, is provided in an external management server. In the configurations of a fourth embodiment, descriptions of the configuration having the same numerals and the parts having the same function as those illustrated in FIG. 1 will be omitted.

FIG. 6 illustrates a power conversion device system according to the present embodiment. The power conversion device system includes a power conversion device 601, a management server 603, and a terminal 604, and is connected to each other via a communication network 602.

The power conversion device 601 has the configuration described with reference to FIG. 1 except for the sign diagnostic unit 115, and communicates with an external device connected via the communication network 602 from the interface unit 117.

The communication network 602 is, for example, a WAN or a LAN, and may be a network used within a specific area or a public network, and connects devices connected via a network by communication.

The management server 603 is, for example, a management server for managing a cloud system and the like, and communicates with the external device connected via the communication network 602. The management server 603 is constituted by a computer such as a personal computer (PC), and includes a CPU, a memory, a bus connecting them, and the like, and operates by a program.

The terminal 604 is, for example, a mobile terminal, a PC, or a tablet terminal, which allows the user to confirm information, inputs information from the power conversion device 601 or the management server 603, and provides information to the user.

In the present embodiment, the sign diagnostic unit 115 is provided in the management server 603. Specifically, the sign diagnostic unit 115 is configured by a program for operating the computer. The operation of the sign diagnostic unit 115 is similar to the operations described in the first, second, and third embodiments already described, but data flow is different. The sign diagnostic unit 115 inputs the restart information stored in the restart recording unit 114 via the interface unit 117 of the power conversion device 601 and the communication network 602, and performs the sign diagnosis within the predetermined period based on the previous restart information stored and retained in the management server 603 to output a result of the diagnosis to the terminal 604. The sign diagnosis is a life diagnosis of life parts of the power conversion device, for example, a smoothing capacitor, a capacitor mounted on a substrate and a cooling fan or a diagnosis of a sign of a change caused by deterioration of cooling capacity due to clogging of fins and the like and deterioration or abnormality of an external system.

In FIG. 6, the terminal 604 is provided separately from the management server 603, but it may be provided integrally with the management server.

According to the present embodiment, it is possible to perform sign detection at a place distant from the power conversion device by the aforementioned method. In addition, it is possible to concentrate and manage a plurality of power conversion devices with one management server.

The present invention is not limited to the aforementioned embodiments, but includes various modified examples. For example, the aforementioned embodiments have been described in detail in order to explain the present invention in an easy-to-understand manner, and are not necessarily limited to those having all the configurations described. Further, a part of the configuration of one embodiment may be replaced by the configuration of another embodiment, and the configuration of another embodiment may be added to the configuration of one embodiment. Further, it is possible to add, delete, and replace other configurations with respect to a part of the configuration of each embodiment.

In addition, each of the aforementioned configurations, functions, processing units, processing means, and the like may be realized in hardware by designing a part or all of them, for example, in an integrated circuit. In addition, each of the aforementioned configurations, functions, and the like may be realized by software by interpreting and executing a program that the processor realizes each function. Information such as a program, a table, a file, or the like that realizes each function may be stored in a memory, a recording device such as a hard disk and an Solid State Drive (SSD) or a recording medium such as an IC card, an SD card, or a DVD.

Further, control lines and information lines considered to be necessary for explanation are illustrated, and not all control lines and information lines are necessarily illustrated for products. In practice, it may be considered that almost all the configurations are mutually connected.

REFERENCE SIGNS LIST

101 Three-phase AC voltage
102 DC conversion unit
103 Smoothing capacitor
104 AC conversion unit
105 User system
106 Current detector
107 Current detection unit
108 Voltage detection unit
109 Temperature detection unit
110 Control unit
111 Drive unit
112 Restart unit
113 Abnormality detection unit
114 Restart recording unit
115 Sign diagnostic unit
116 Input/output unit
117 Interface unit
601 Power conversion device
602 Communication network
603 Management server
604 Terminal

The invention claimed is:

1. A power conversion device that converts DC voltage or AC voltage into AC voltage, the power conversion device comprising:
an abnormality detection unit that detects abnormality in the power conversion device;
a restart unit that stops the power conversion device and automatically performs a restart when the abnormality detection unit has detected an abnormality;
a restart recording unit that records restart information acquired when the restart unit has restarted; and
a sign diagnostic unit that inputs the restart information recorded in the restart recording unit and performs a sign diagnosis of the abnormality in the power conversion device on the basis of the restart information,
wherein the sign diagnostic unit performs the sign diagnosis on the basis of the number of restarts and outputs a sign diagnosis result.

2. The power conversion device according to claim 1, wherein the sign diagnostic unit diagnoses the abnormality and outputs the sign diagnosis result when the number of restarts within a predetermined period exceeds a predetermined value.

3. The power conversion device according to claim 1, wherein the sign diagnostic unit compares the number of restarts in a first predetermined period with the number of restarts in a second predetermined period included in the first predetermined period to perform the sign diagnosis of the power conversion device and outputs the sign diagnosis result.

4. The power conversion device according to claim 1, wherein the sign diagnostic unit compares the number of restarts in a first predetermined period with the number of restarts in a second predetermined period not overlapped with the first predetermined period to perform the sign diagnosis of the power conversion device and outputs the sign diagnosis result.

5. The power conversion device according to claim 1, further comprising a current detector that detects an output current of the power conversion device,
wherein the abnormality detection unit detects an abnormality caused by overcurrent detected by the current detector, and
wherein the sign diagnostic unit performs the sign diagnosis on the basis of the number of restarts caused by the overcurrent.

6. The power conversion device according to claim 1, further comprising:
a DC smoothing circuit that smoothes the DC voltage;
an AC conversion unit that converts the DC voltage into the AC voltage; and
a voltage detection unit that detects the DC voltage of the DC smoothing circuit,
wherein the abnormality detection unit detects an abnormality caused by overvoltage detected by the voltage detection unit, and wherein the sign diagnostic unit performs the sign diagnosis on the basis of the number of restarts caused by the overvoltage.

7. The power conversion device according to claim 1, comprising:
a DC smoothing circuit that smoothes the DC voltage;
an AC conversion unit that converts the DC voltage into the AC voltage; and
a voltage detection unit that detects the DC voltage of the DC smoothing circuit,
wherein the abnormality detection unit detects an abnormality caused by undervoltage detected by the voltage detection unit, and
wherein the sign diagnostic unit performs the sign diagnosis on the basis of the number of restarts caused by the undervoltage.

8. The power conversion device according to claim 1, further comprising a temperature detection unit that detects a temperature of the power conversion device,
wherein the abnormality detection unit detects an abnormality caused by a temperature abnormality detected by the temperature detection unit, and
wherein the sign diagnostic unit performs the sign diagnosis on the basis of the number of restarts caused by the temperature abnormality.

9. The power conversion device according to claim 1, further comprising an output unit,
wherein the sign diagnostic unit outputs the sign diagnosis result to the output unit.

10. The power conversion device according to claim 9, wherein the restart recording unit outputs restart information to the output unit at the restart.

11. A power conversion device system comprising a power conversion device that converts DC voltage or AC voltage into AC voltage, a management server, and a terminal connected via a communication network,
wherein the power conversion device includes:
an abnormality detection unit that detects abnormality in the power conversion device;
a restart unit that stops the power conversion device and automatically performs a restart when the abnormality detection unit has detected an abnormality;
a restart recording unit that records restart information acquired when the restart unit has restarted; and
an interface unit that outputs the restart information to a communication network, and
wherein the management server includes:
a sign diagnostic unit that inputs the restart information recorded in the restart recording unit and performs a sign diagnosis of the abnormality in the power conversion device on the basis of the restart information, and
wherein the sign diagnostic unit of the management server performs the sign diagnosis on the basis of the number of restarts and outputs a sign diagnosis result to the terminal.

12. The power conversion device system according to claim 11, wherein the sign diagnostic unit of the management server diagnoses the abnormality and outputs the sign diagnosis result when the number of restarts within a predetermined period exceeds a predetermined value.

13. The power conversion device system according to claim 11, wherein the sign diagnostic unit of the management server compares the number of restarts in a first predetermined period with the number of restarts in a second predetermined period included in the first predetermined period to perform the sign diagnosis of the power conversion device and outputs the sign diagnosis result.

14. The power conversion device system according to claim 11, wherein the sign diagnostic unit of the management server compares the number of restarts in a first predetermined period with the number of restarts in a second predetermined period not overlapped with the first predetermined period to perform the sign diagnosis of the power conversion device and outputs the sign diagnosis result.

* * * * *